United States Patent
Eguchi et al.

(10) Patent No.: US 10,670,406 B2
(45) Date of Patent: Jun. 2, 2020

(54) CONTROL, APPARATUS FOR AUTONOMOUSLY NAVIGATING UTILITY VEHICLE

(71) Applicant: HONDA MOTOR CO., LTD., Tokyo (JP)

(72) Inventors: Junichi Eguchi, Wako (JP); Toshiaki Kawakami, Wako (JP); Jin Nishimura, Wako (JP); George Murakami, Yokohama (JP); Kouichi Okada, Yokohama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/885,013

(22) Filed: Oct. 16, 2015

(65) Prior Publication Data

US 2016/0109241 A1 Apr. 21, 2016

(30) Foreign Application Priority Data

Oct. 21, 2014 (JP) ................................ 2014-214783

(51) Int. Cl.
*G01C 21/20* (2006.01)
*G01R 33/02* (2006.01)

(52) U.S. Cl.
CPC .............. *G01C 21/20* (2013.01); *G01R 33/02* (2013.01)

(58) Field of Classification Search
CPC ........ G05D 1/0265; G01R 33/02; H03M 5/12
See application file for complete search history.

(56) References Cited

U.S. PATENT DOCUMENTS

| 4,215,759 A | 8/1980 | Diaz |
| 5,175,480 A * | 12/1992 | McKeefery .......... G05D 1/0265 180/168 |
| 5,940,346 A * | 8/1999 | Sadowsky ................. G01S 5/30 367/120 |
| 6,079,367 A * | 6/2000 | Stapelfeld ............ A01K 15/021 119/719 |
| 6,465,982 B1 * | 10/2002 | Bergvall ............... A47L 9/2805 318/587 |

(Continued)

FOREIGN PATENT DOCUMENTS

DE 20 2010 008 800 1/2012
EP 2 447 799 A2 5/2012

(Continued)

*Primary Examiner* — Donald J Wallace
(74) *Attorney, Agent, or Firm* — Rankin, Hill & Clark LLP

(57) ABSTRACT

In an apparatus for controlling operation of an autonomously navigating utility vehicle adapted to run about a working area defined by a boundary wire which generates magnetic field therearound when supplied with electric current and having a magnetic sensor that produces an output indicating intensity of magnetic field generated by the boundary wire and a position determining unit that determine a position of the vehicle with respect to the working area based on the output of the magnetic sensor, a coded data signal determined to be inherent to the working area is generated and supplied to the electric current, and the position determining unit detects the data signal and determines the position of the vehicle based on a rate of concordance of the detected data signal and a reference signal.

16 Claims, 6 Drawing Sheets

(56) References Cited

U.S. PATENT DOCUMENTS

| | | | | |
|---|---|---|---|---|
| 2005/0230166 A1* | 10/2005 | Petersson | ............ | A01D 34/008 180/170 |
| 2005/0267629 A1* | 12/2005 | Petersson | ............ | A01D 34/008 700/245 |
| 2008/0097645 A1* | 4/2008 | Abramson | ............ | A01D 34/008 700/258 |
| 2013/0018527 A1* | 1/2013 | Bernini | ................ | A01D 34/008 701/2 |
| 2013/0154688 A1* | 6/2013 | Petereit | ................ | A01K 15/023 327/72 |
| 2015/0033305 A1* | 1/2015 | Shear | ..................... | G06F 21/45 726/6 |
| 2016/0014955 A1 | 1/2016 | Hans | | |

FOREIGN PATENT DOCUMENTS

| | | | | |
|---|---|---|---|---|
| EP | 2 741 160 A1 | 6/2014 | | |
| FR | 2324047 A1 * | 4/1977 | ........... | A01B 69/008 |
| WO | 03/104908 A1 | 12/2003 | | |

* cited by examiner

<INSIDE OF WORKING AREA>

<OUTSIDE OF WORKING AREA>

CONTROL, APPARATUS FOR AUTONOMOUSLY NAVIGATING UTILITY VEHICLE

CROSS-REFERENCE TO RELATED APPLICATION

This application is based upon and claims the benefit of priority from Japanese Patent Application No. 2014-214783 filed on Oct. 21, 2014, the contents of which are incorporated herein by reference.

BACKGROUND OF THE INVENTION

Field of the Invention

This invention relates to a control apparatus for an autonomously navigating utility vehicle, particularly to an apparatus, used in a utility vehicle that autonomously navigates and works in a working area, that controls operation of a work unit while determining a position (self-position) with respect to the working area.

Description of Related Art

Among prior art control apparatuses that determine a position of the autonomously navigating utility vehicle with respect to a working area in order to control operation of a work unit can be cited, for example, those taught by Patent Documents 1 and 2.

A technical concept taught by Patent Document 1 (International Patent Publication No. WO/2003/104908 corresponding to Japanese Patent No. 4246701, etc.) is to determine a position with respect to a working area by detecting a magnetic field generated by passing an electric current of predetermined pulse width through a boundary wire (electric cable) delineating the working area.

More specifically, generation of current pulses transmitted from a signal generator to the boundary wire and detection by a detector (sensor) are synchronized so as to detect a magnetic field generated by the boundary wire while avoiding influence of noise, thereby determining whether the vehicle has gone outside the working area.

A technical concept taught by Patent Document 2 (European Patent Application Publication No. 2447799) is to encode a current (to be supplied to a boundary wire) by a signal generator and accurately determine a position with respect to a working area by recognizing the code concerned from change in magnetic field intensity detected by a sensor.

SUMMARY OF THE INVENTION

A point of interest in this is that the magnetic field intensity generated by the boundary wire is inversely proportional to distance of the vehicle from the boundary wire, i.e., that the magnetic field intensity diminishes with increasing distance of the vehicle from the boundary wire, which makes accurate determination of the position with respect to a large working area difficult.

Moreover, noise picked up by the sensor includes periodically-generated noise similar to that generated by the vehicle itself, so that when a configuration is adopted to detect the magnetic field every specified period as taught by Patent Document 1, the position of the vehicle may be falsely determined depending on the noise generation timings.

In addition, the teachings of Patent Documents 1 and 2 both require processing for synchronizing the signal transmitted to the boundary wire and the signal detected by the sensor. In Patent Document 2, for example, as explained with reference to, inter alia, FIGS. 5 to 7 thereof, the code detected by the sensor has to be data processed to determine whether the detected code includes a code generated by the signal generator and transmitted to the boundary wire.

However, the need to synchronization-process the detected code complicates the processing to a proportional extent, and in a case where the distance from the wire is great or where the synchronization processing cannot be performed due to the noise generation timings, accurate determination of the vehicle position may sometimes be impossible.

The object of this invention is to overcome the aforesaid problems by providing a control apparatus for an autonomously navigating utility vehicle configured to avoid influence of noise and enable accurate position determination with respect to a working area without performing synchronization processing of a detected signal.

In order to achieve the object, this invention provides in its first aspect an apparatus for controlling operation of an autonomously navigating utility vehicle adapted to run about a working area, defined by a boundary wire which generates magnetic field therearound when supplied with electric current, to perform working autonomously, and having a magnetic sensor that produces an output indicating intensity of magnetic field generated by the boundary wire and a position determining unit that determines a position of the vehicle with respect to the working area based on the output of the magnetic sensor, comprising: a magnetic field generator that generates a coded data signal determined to be inherent to the working area and supplies the electric current in the generated coded data signal to the boundary wire; wherein the position determining unit detects the data signal from the output of the magnetic sensor and determines the position of the vehicle with respect to the working area based on a rate of concordance of the detected data signal and a reference signal.

In order to achieve the object, this invention provides in its second aspect a method for controlling operation of an autonomously navigating utility vehicle adapted to run about a working area, defined by a boundary wire which generates magnetic field therearound when supplied with electric current, to perform working autonomously and having a magnetic sensor that produces an output indicating intensity of magnetic field generated by the boundary wire, comprising steps of: determining a position of the vehicle with respect to the working area based on the output of the magnetic sensor, and generating a coded data signal determine to be inherent to the working area and supplies the electric current in the generated coded data signal to the boundary wire; wherein the step of position determining detects the data signal from the output of the magnetic sensor and determines the position of the vehicle with respect to the working area based on a rate of concordance of the detected data signal and a reference signal.

BRIEF DESCRIPTION OF THE DRAWINGS

The above and other objects and advantages will be more apparent from the following description and drawings, in which.

DETAILED DESCRIPTION OF THE INVENTION

A control apparatus for an autonomously navigating utility vehicle according to an embodiment of this invention is explained with reference to the attached drawings in the following.

Figure 1:
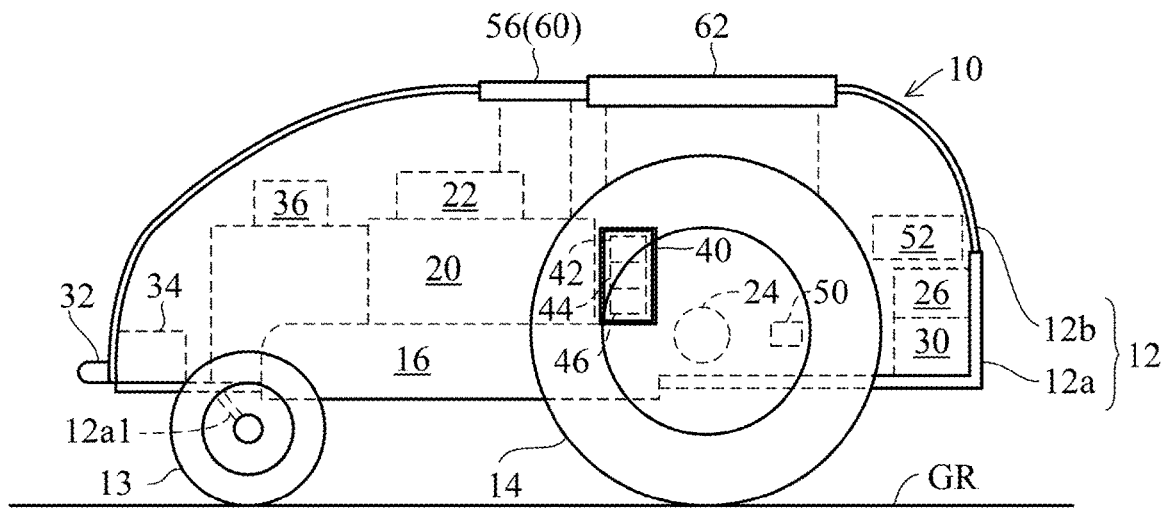
FIG. 1 is an overall schematic diagram showing a control apparatus for an autonomously navigating utility vehicle according to an embodiment of this invention.
Figure 2:
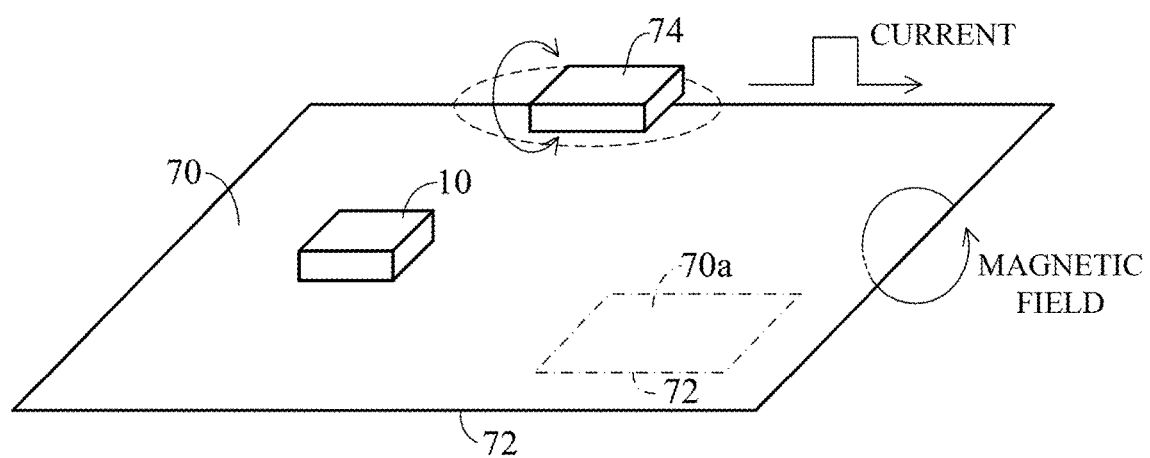
FIG. 2 is an explanatory diagram explaining work of the autonomously navigating utility vehicle controlled by the control apparatus shown in FIG. 1.
Figure 3:
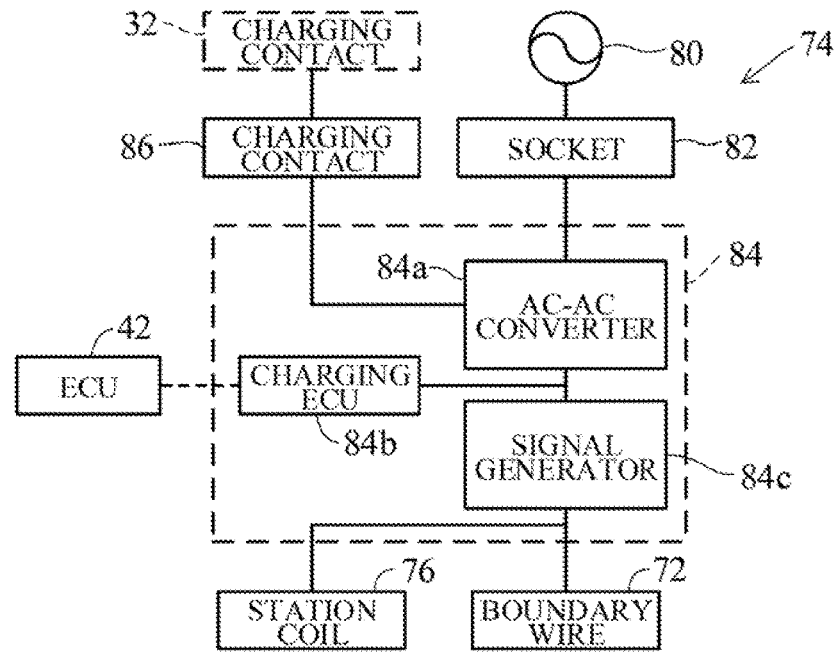
FIG. 3 is a block diagram showing configuration of a charging station of the autonomously navigating utility vehicle shown in FIG. 1 and a magnetic field generator.

FIG. 1 is an overall schematic diagram showing a control apparatus for an autonomously navigating utility vehicle according to an embodiment of this invention, FIG. 2 is an explanatory diagram explaining work of the autonomously navigating utility vehicle controlled by the control apparatus shown in FIG. 1, and FIG. 3 is a block diagram showing configuration of a charging station of the autonomously navigating utility vehicle shown in FIG. 1 and a magnetic field generator. Elements shown in FIG. 1 is simplified in FIG. 2 for ease of brevity.

As shown in FIG. 1, reference symbol 10 designates an autonomously navigating utility vehicle, e.g., a mower; hereinafter called "vehicle". A body 12 of the vehicle 10 comprises a chassis 12a and a frame 12b attached thereto. The vehicle 10 is equipped with relatively small diameter left and right front wheels 13 rotatably fastened to a front end of the chassis 12a through stays 12a1 and relatively large diameter left and right rear wheels 14 rotatably fastened to the chassis 12a directly.

A work unit, e.g., a mower blade (rotary blade) 16, is attached near the middle of the chassis 12a of the vehicle 10, and an electric motor 20 is installed above it. The blade 16 is connected to the electric motor 20 to be driven to rotate by the electric motor (hereinafter called "work motor") 20.

A blade height regulation mechanism 22 manually operable by an operator is connected to the blade 16. The blade height regulation mechanism 22 is equipped with a screw (not shown) and configured to enable the operator to regulate the height of the blade 16 above ground level GR by manually rotating the screw.

Two electric motors (hereinafter called "travel motors") 24 are attached to the chassis 12a of the vehicle 10 at a rear end of the blade 16. The travel motors 24 are connected to the left and right rear wheels 14 and rotate normally (rotate to move forward) or reversely (rotate to move backward) independently on the left and right, with the front wheels 13 as non-driven wheels and the rear wheels 14 as driven wheels. The blade 16, work motor 20, travel motors 24 and so on are covered by the frame 12b.

A battery charging unit (including an AC-DC converter) 26 and a battery 30 are housed at the rear of the vehicle 10, and two charging terminals 32 are attached to the frame 12b so as to project forward.

The charging terminals 32 are connected to the charging unit 26 through cables, and the charging unit 26 is connected to the battery 30 by cables. The work motor 20 and the travel motors 24 are configured to be powered by the battery 30 through connecting cables. The cables are not shown in FIGS. 1 and 2.

The vehicle 10 is thus configured as a 4-wheel, electrically-powered, autonomously navigating utility vehicle (e.g., a mower).

Left and right magnetic sensors 34 are installed at the front of the vehicle 10 at positions laterally symmetrical with respect to a center line extending in the straight forward direction of the vehicle 10. A contact sensor 36 is attached to the frame 12b. The contact sensor 36 outputs an ON signal when the frame 12b detaches from the chassis 12a owing to contact with an obstacle or foreign object.

A housing box installed near the middle of the vehicle 10 houses a printed circuit board 40 carrying an ECU (Electronic Control Unit) 42, which comprises a microcomputer having CPU, ROM, RAM, and in the vicinity thereof are installed an angular velocity sensor (yaw-rate sensor; yaw sensor) 44 that generates an output indicating angular velocity (yaw-rate) around a center-of-gravity z-axis (vertical axis) of the vehicle 10 (whose time-integrated value indicates a turn angle around the vertical axis), a G sensor (acceleration sensor) 46 that generates an output indicating acceleration G acting on the vehicle 10 in x, y and z (3-axis) directions.

Wheel speed sensors 50 installed near the rear wheels (driven wheels) 14 produce outputs indicating the wheel speeds of the rear wheels 14, and a lift sensor 52 installed between the chassis 12a and the frame 12b outputs an ON signal when the frame 12b is lifted off the chassis 12a by the operator or other worker. The vehicle 10 is equipped with a main switch 56 and an emergency stop switch 60 both operable by the operator.

The outputs of the magnetic sensors 34, contact sensor 36, angular velocity sensor 44, G sensor 46, wheel speed sensors 50, lift sensor 52, main switch 56, and emergency stop switch 60 are sent to the ECU 42. The ECU 42 is also connected to the work motor 20 and travel motors 24 through their driver circuits.

The top of the frame 12b of the vehicle 10 has a large cutaway in which a display 62 is fitted. The display 62 is connected to the ECU 42 and displays working modes and the like in accordance with commands from the ECU 42.

Next, a working area 70 of the vehicle 10 and work performed by the vehicle 10 are explained with reference to FIG. 2. The vehicle 10 is configures to run about the working area 70 to perform the work.

The working area 70 is delineated by laying (burying) a boundary wire (electrical wire) 72 around its periphery (boundary). Further, a charging station 74 for charging a battery 30 of the vehicle 10 is installed above the boundary wire 72. The sizes of the vehicle 10 and charging station 74 in FIG. 2 are exaggerated.

As shown in FIG. 3, the charging station 74 is equipped with a charger 84 connected through a socket 82 to a commercial power supply 80, and charging terminals 86 connected to the charger 84 and connectable to contacts of charging terminals 32 of the vehicle 10.

The charger 84 is equipped with an AC-AC converter 84a, a charging ECU (Electronic Control Unit) 84b also comprising a microcomputer having CPU, ROM, RAM and used to control operation of the AC-AC converter 84a, and a signal generator 84c for generating a signal by passing alternating current through the boundary wire 72 and a station coil 76. As shown, the ECU 84b is connected to the ECU 42 through a bus. The ECU 84b and the signal generator 84c are in combination referred to herein as "magnetic field generator."

The charging station 74 is configured so that alternating current passing from the commercial power supply 80 through the socket 82 is stepped down to a suitable voltage by the AC-AC converter 84a of the charger 84 and sent to the vehicle 10 to charge the battery 30 via a charging unit 26 when the vehicle 10 is returned and connected to the charging station 74 through the charging contacts 32 and 86.

The position (self-position) determination of the vehicle 10 with respect to the working area 70 is explained again referring to FIG. 2.

When electric current is supplied to the boundary wire 72 by the signal generator 84c, a right-handed magnetic field is generated around the boundary wire 72 (Ampere's right-hand screw rule). The magnetic field intensity detected at this time differs depending on the total length of the boundary wire 72 and also differs with distance of the vehicle 10 from the boundary wire 72.

Therefore, based on the magnetic field intensity of the boundary wire 72 detected by the magnetic sensor 34 installed in the vehicle 10, the ECU 42 can determine the position (self-position) of the vehicle 10 with respect to the working area 70, more exactly the positional relationship between the vehicle 10 and the boundary wire 72, and control the work of the vehicle 10 based thereon.

Here, prior art processing for determining the aforesaid positional relationship between the vehicle 10 and the boundary wire 72 will now be explained with reference to FIGS. 7 and 8A to 8C.

Figure 7:
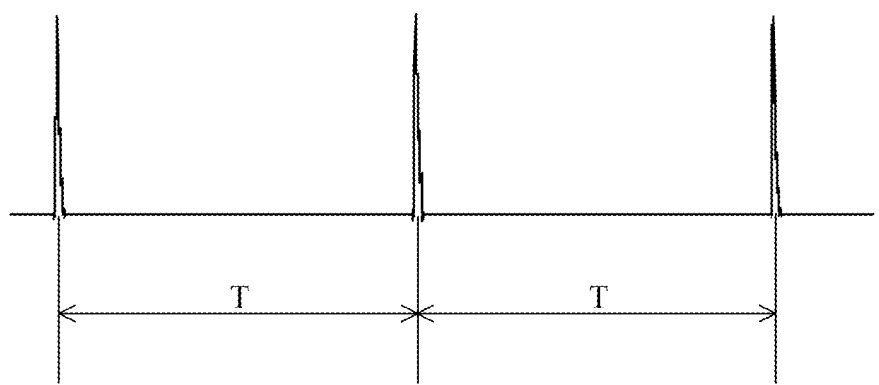
FIG. 7 is an explanatory diagram, similar to FIG. 4, but showing pulse signals generated in the prior art.
Figure 8A:
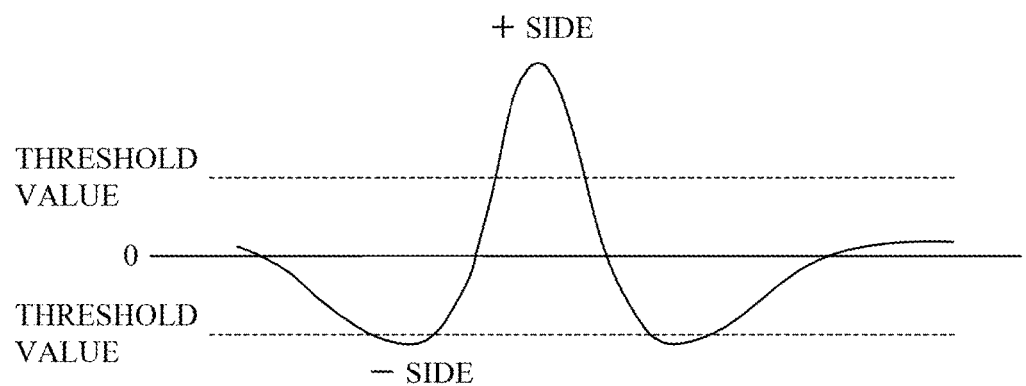
FIGS. 8A to 8C are a set of diagrams explaining a detected pulse signal in the prior art and position determination processing in the prior art.
Figure 8B:
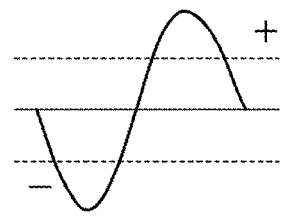
Figure 8C:
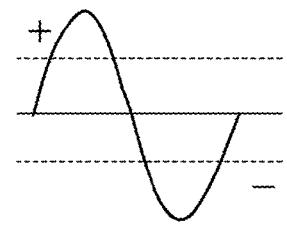

FIG. 7 is an explanatory diagram showing pulse signals generated in the prior art, and FIG. 8A to 8C are a set of diagrams explaining a received pulse signal (magnetic field intensity detected by the magnetic sensor 34) in the prior art and position determination processing in the prior art.

As typified by the prior art set out in the aforesaid Patent Document 1, the prior art practice has been to supply a periodic pulse train signal such as shown in FIG. 7 from the signal generator 84c to the boundary wire 72 and to detect (receive) the intensity of the so-generated magnetic field with the magnetic sensor 34 installed in the vehicle 10 (FIG. 8A).

The ECU 42 installed in the vehicle 10 detects the position based on the detected magnetic field intensity, specifically determines whether the vehicle 10 is inside or outside the working area 70, and detects (calculates) the distance between the vehicle 10 and the boundary wire 72. More specifically, the ECU 42 determines the position of the vehicle 10 with respect to the working area 70 based on the detected magnetic field intensity.

The prior art determination of whether the vehicle 10 is inside or outside the working area 70 will be explained more concretely.

As was explained with reference to FIG. 2, the magnetic field generated by the boundary wire 72 obeys Ampere's right-hand screw rule and its direction is therefore reversed between inside and outside the working area 70. From this it follows that the pulse signal detected by the magnetic sensor 34 also reverses in direction (+/−) between inside and outside the working area 70, notwithstanding that the same signal is detected.

In other words, as shown in FIG. 8B, when the vehicle 10 is inside the working area 70, the pulse signal detected by the magnetic sensor 34 appears as a rising pulse signal, in other words as a signal that rises from the minus (−) side toward the plus (+) side. On the other hand, as shown in FIG. 8C, when the vehicle 10 is outside the working area 70, the pulse signal detected by the magnetic sensor 34 appears as a falling pulse signal, in other words as a signal that falls from the plus (+) side toward the minus (−) side.

In the prior art, the aforesaid signal characteristic is used as a reference signal to determine whether the vehicle 10 is inside or outside of the working area 70, and a configuration is adopted for determining whether the detected pulse signal exceeds a certain threshold value to avoid influence of noise at this time. When a threshold value is set as in the prior art, the influence of low-output noise can be largely avoided.

Figure 9:
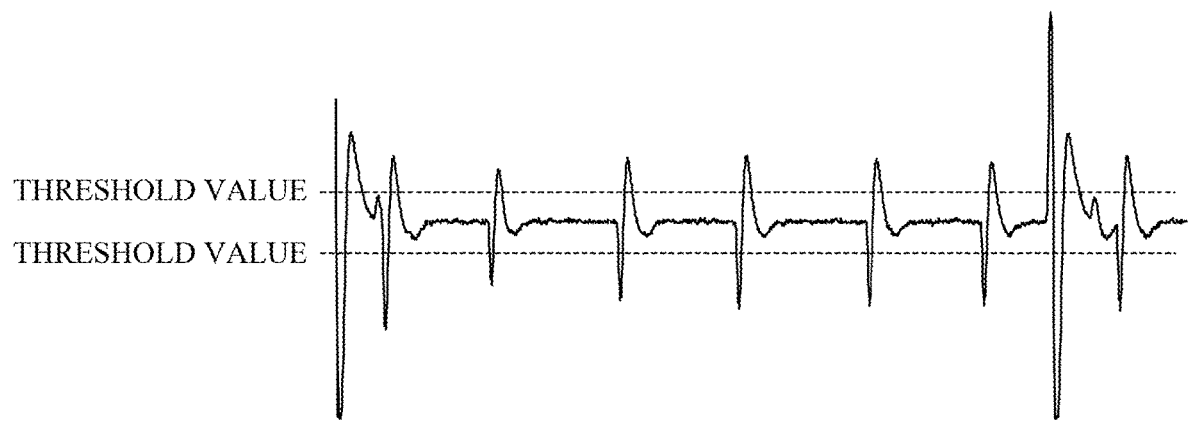
FIG. 9 is an explanatory diagram showing noise generated by operation of the autonomously navigating utility vehicle shown in FIG. 1.

However, the position of the vehicle 10 is apt to be falsely determined should a noise exceeding the threshold value be inputted. For example, a noise higher than the threshold value as indicated in FIG. 9 is sometimes periodically generated like that generated by the electric motor 20 itself, so that the self-position of the vehicle 10 is liable to be falsely determined in the prior art.

Moreover, if the threshold value is set to a high value in order to avoid the influence of high noise, determination of the position of the vehicle 10 is likely to be difficult when the distance between the vehicle 10 and the boundary wire 72 is great, so that setting the threshold value to a high value is undesirable especially when controlling the vehicle 10 in a large working area 70.

Figure 10:
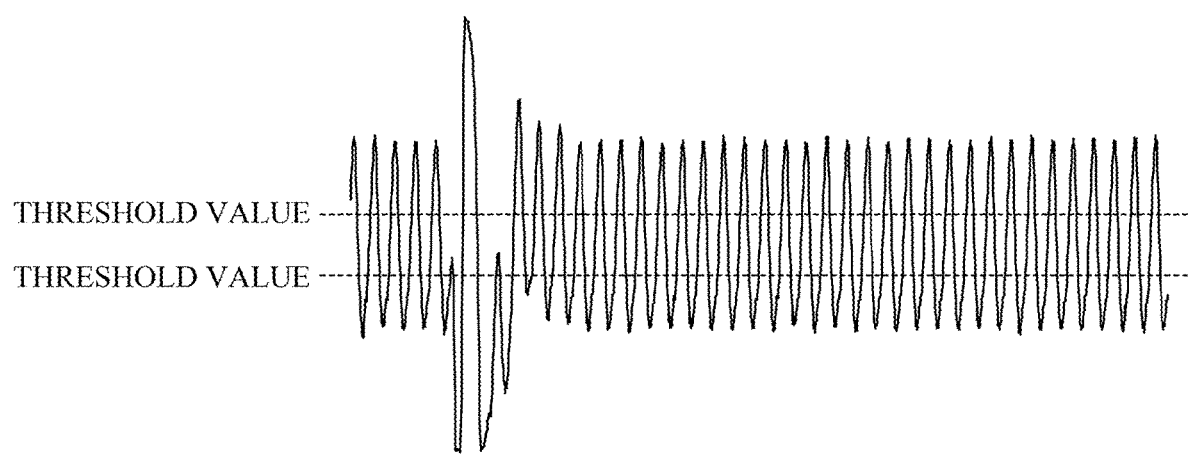
FIG. 10 is an explanatory diagram explaining effects of surrounding environment on the position determination of the autonomously navigating utility vehicle.

Moreover, in a case where the working area 70 of the vehicle 10 and the working area of another vehicle are adjacent, as shown in FIG. 10, there may be continually detected, in addition to the signal transmitted by the signal generator 84c associated with the vehicle 10, another signal exceeding the threshold value, in which case it would be impossible by the prior art to accurately determine the position of the vehicle 10 (i.e., whether the vehicle 10 is inside or outside its working area 70).

The aforesaid inconveniences are overcome by this embodiment of the invention.

Now follows a concrete explanation.

Figure 4:
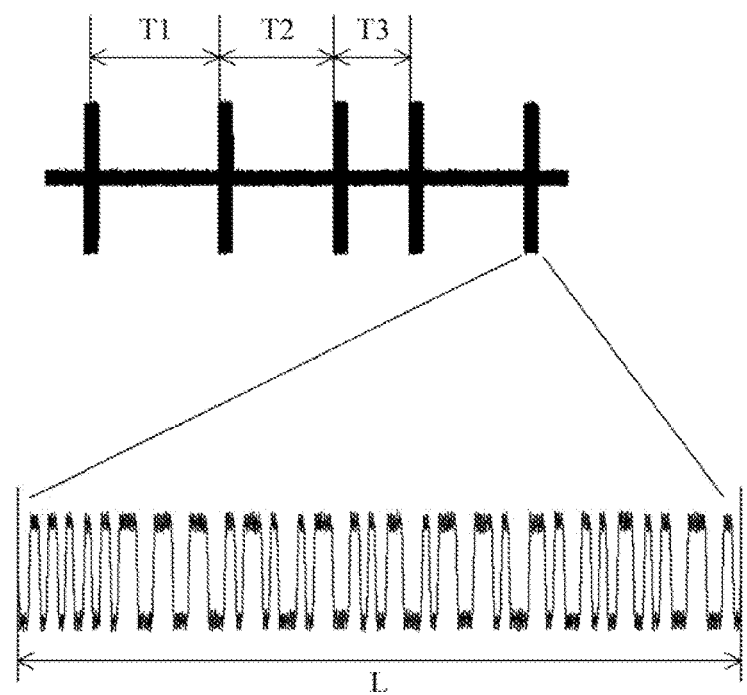
FIG. 4 is an explanatory diagram showing pulse signals generated by the magnetic field generator shown in FIG. 3.
Figure 5:
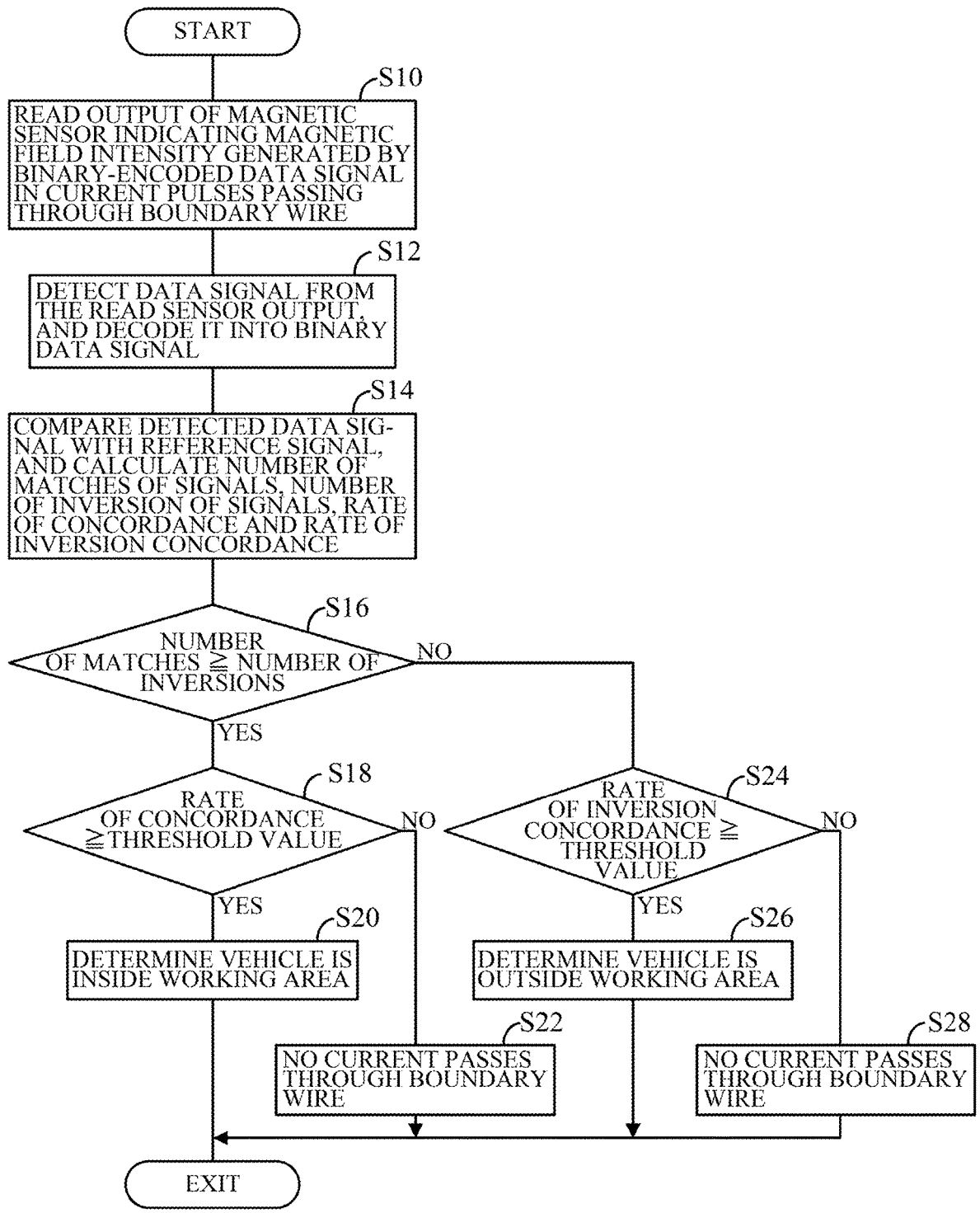
FIG. 5 is a flowchart showing operation of the control apparatus shown in FIG. 1.
Figure 6:
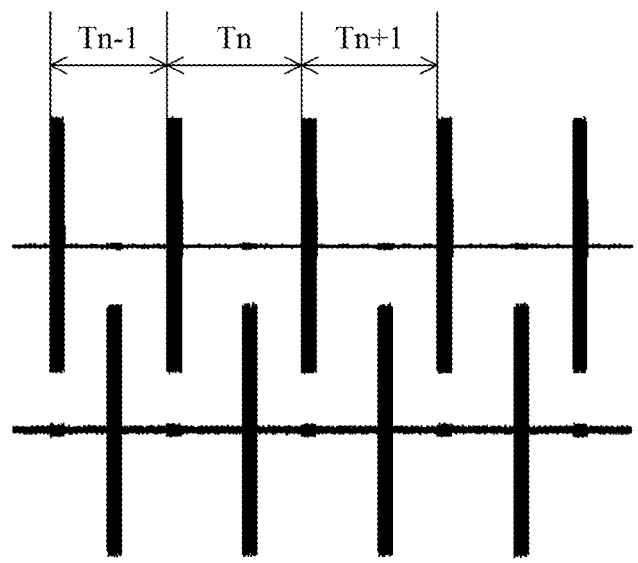
FIG. 6 is an explanatory diagram for explaining a relationship between pulse signals generated by the magnetic field generator shown in FIG. 3 and pulse signals generated by another apparatus.

FIG. 4 is an explanatory diagram showing pulse signals generated by the magnetic field generator (charging ECU 84b and signal generator 84c), FIG. 5 is a flowchart showing operation of the ECU 42, i.e., position determination processing conducted by the ECU 42, and FIG. 6 is an explanatory diagram explaining a relationship between pulse signals generated by the magnetic field generator 84b, 84c in this embodiment and pulse signals generated by another apparatus.

In this embodiment, the signal generator 84c converts electric current to be passed through the boundary wire 72 into a data signal in continuance sequence by binarization and Manchester encoding and supplies the data signal to the boundary wire 72 at random period, as shown in FIG. 4.

Specifically, by sequentially arraying the electric current pulses (to be passed through the boundary wire 72 and appearing a train of falling and rising pulses) into data pulses binarized as 0, 1, more precisely as a falling edge when 0 (symbol 10) and as a rising edge when 1 (symbol 01), and the generation times of data signals (in other words, the time intervals between data signals) T1, T2, T3 are randomly set as shown in FIG. 4. The signal lengths L of the data signals shown in the lower part of FIG. 4 can be set as desired, i.e., can be randomly set.

It should be noted here that the data signal is determined or predetermined differently for different working areas so that the data signal is determined to be inherent to the working area 70. To be more specific, as shown by phantom lines in FIG. 2, if another working area 70a is provided by the boundary wire 72, another data signal is to be determined and supplied to the boundary wire 72 defining the another working area 70a.

Now follows an explanation with reference to FIG. 5 of the processing conducted by the ECU 42 for determining the self-position of the vehicle 10.

The program begins at S10, in which the output of the magnetic sensor 34 indicating the intensity of the magnetic field generated by the current pulse passing through the boundary wire 72 (more exactly, the binary-encoded data signal in the current pulse) is read.

The program next proceeds to S12, in which the data signal read from the output of the magnetic sensor 34 is inputted and decoded. Specifically, the change in magnetic field intensity detected by the magnetic sensor 34 against the data signal generated by the magnetic field generator 84b, 84c and supplied to the boundary wire 72 is inputted and decoded (converted) into binary data signal.

The program then proceeds to S14, in which the inputted (converted) data signal is compared with a reference signal stored in memory (ROM or RAM) beforehand. Specifically, the number whose values are the same between the inputted signal and the reference signal (number of matches) and the number whose values are inverted between the inputted signal and the reference signal (number of inversions) are calculated, and a rate of concordance and a rate of inversion concordance of the inputted signal with respect to the reference signal are calculated from the calculated number of matches and number of inversions.

Now to amplify on the processing for calculating the number of matches and the number of inversions:

As pointed out above, in a case where the vehicle 10 is outside the boundary wire 72, as opposed to a case where the vehicle 10 is inside the boundary wire 72, the value of the data signal detected and inputted based on the output of the magnetic sensor 34 is the value obtained by inverting the bits 0, 1 respectively.

Here, in the embodiment, the reference signal stored in memory beforehand comprises a signal that is same as the data signal generated by the signal generator 84c. Specifically, the reference signal comprises a signal that is same as the detected data signal when the vehicle 10 is at one of a location inside the working area 70 and a location outside the working area 70, more specifically, it is the detected data signal when the vehicle 10 is inside the working area 70. In other words, the rate of concordance is defined to become 100% when the vehicle 10 is inside the working area 70 and the inputted data signal and reference signal are perfectly synchronized.

In addition, in order to determine the position of the vehicle 10 more accurately when the vehicle 10 is outside the boundary wire 72, the inputted signal and the reference signal are preferably compared after inverting one or the other of the signals (the inputted signal in this embodiment). So this embodiment is arranged to calculate both the number of inversions and the rate of inversion concordance in S14.

Now to continue the explanation of FIG. 5, the program next proceeds to S16, in which it is determined whether the number of matches between the two signals calculated in S14 (inputted data signal and reference signal) is equal to or greater than the number of inversions between the two signals also calculated in S14. When the result in S16 is YES, the program proceeds to S18, in which it is determined whether the rate of concordance (a rate of number of matches of the two signals calculated in S14) is equal to or greater than a threshold value (for example, whether about 70% of the received data signal with respect to the total data length matches the reference signal).

When the result in S18 is YES, the program proceeds to S20, in which it is determined that the vehicle 10 is inside the working area 70.

On the other hand, when the result in S18 is NO, the program proceeds to S22, in which it is determined that no electric current is passing through the boundary wire 72, specifically, it is under one or the other of a condition in which no data signal is being generated by the signal generator 84c and a condition in which no data signal is passing through the boundary wire 72 owing to discontinuity of the boundary wire 72.

Since, as set forth above regarding this embodiment, the value of the data signal is Manchester encoded, the value of the signal is expressed as a falling edge when 0 (symbol 10) and as a rising edge when 1 (symbol 01).

Accordingly, when no current is passing, a condition of no signal being detected can be expressed by symbol 00, namely, a value that is neither 0 nor 1. In such case, the rate of concordance (or rate of inversion concordance) does not become equal to or greater than the threshold value in the determination of S18 or S24 discussed later, so that it can be determined that the condition is one of no current passing through the boundary wire 72.

When the result in S16 is NO, the program proceeds to S24, in which it is determined whether the rate of inversion concordance calculated in S14 (i.e., a rate of the number of inversions of the detected data signals with respect to the reference signal) is equal to or greater than the threshold value. When the result in S24 is YES, the program proceeds to S26, in which it is determined that the vehicle 10 is outside the working area 70.

On the other hand, when the result in S24 is NO, i.e., when it is determined that the rate of inversion concordance is less than the threshold value, the program proceeds to S28, in which it is determined that no electric current is passing through the boundary wire 72, specifically, the condition is one or the other between a condition in which no data signal is being generated by the signal generator 84c and a condition in which no data signal is passing through the boundary wire 72 owing to discontinuity of the boundary wire 72.

Thus, in this embodiment, since the position of the vehicle 10 is determined based on the data signal determined to be inherent to the working area 70, it is possible to determine the position of the vehicle 10 accurately without need for processing to synchronize the signal detected by the magnetic sensor 34 with the reference signal.

Specifically, since the position is determined based on the rate of signal concordance (and rate of inversion concordance) of the reference signal and inputted signals, it is possible by setting the threshold values appropriately to determine the position of the vehicle 10 accurately without need for processing to synchronize the inputted signal with the reference signal.

More specifically, by setting the threshold values appropriately, it is possible to determine the position of the vehicle 10 more accurately without need for processing to synchronize the inputted signal with the reference signal.

Moreover, unlike in the prior art, no threshold value for avoiding the influence of noise is required, so that the data signal can be accurately detected even at a place remote from the boundary wire 72, whereby servicing of a large working area 70 becomes possible.

Furthermore, as shown in FIG. 4 and FIG. 6, in this embodiment, the signal generator 84c is adapted to generate the data signals randomly, i.e., to set the time intervals Tn−1, Tn, Tn+1 between the data signals transmitted to the boundary wire 72 randomly.

That is to say, this embodiment is configured to determine the position of the vehicle 10 with respect to the working area 70 based on the rate of concordance (and rate of inversion concordance) of the inputted data signal and the reference signal determined to be inherent to the working area 70, making synchronization processing requiring signal onset detection unnecessary, so that data signal transmission (generation) timing can be randomized. Therefore, as shown in FIG. 6, interference with a signal generated by another apparatus can be avoided and the position of the vehicle 10 and therefore be more accurately determined.

Moreover, as was explained with reference to FIG. 4, the signal length L can be randomly set and multiple data signals (coding sequences) can be transmitted, thus making it possible not only to determine whether the vehicle 10 is inside or outside the working area 70 but also to control other operations.

For example, purpose-specific data signals can be defined in advance that when detected cause the vehicle 10 to be forcibly stopped, moved to a specified location or otherwise controlled. Further, by including working-area-specific data signals (coding sequences), the vehicle 10 is enabled to service multiple working areas 70 alone by receiving the same as input. It is also possible to arrange for each operator to use an individualized data sequence, whereby the vehicle 10 can be protected by more robust theft deterrence without need for conventional ID authentication processing.

Figure 11:
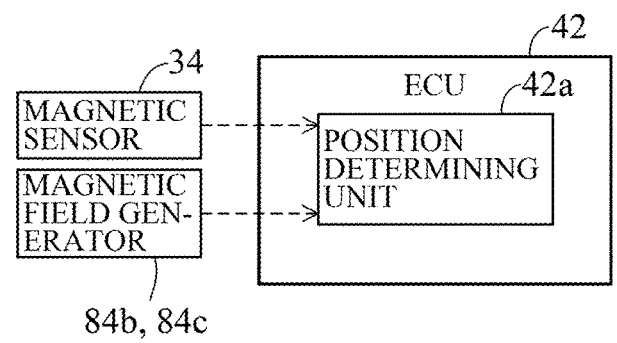
FIG. 11 is an explanatory diagram explaining configuration of an ECU shown in FIG. 1.

As stated above, the embodiment is configured, as shown in FIG. 11, an apparatus and method for controlling operation of an autonomously navigating utility vehicle (10) adapted to run about a working area (70), defined by a boundary wire (72) which generates magnetic field therearound when supplied with electric current, to perform working autonomously, and having a magnetic sensor (34) that produces an output indicating intensity of magnetic field generated by the boundary wire (72) and a position determining unit (42a) that determines a position of the vehicle (10) with respect to the working area (70) based on the output of the magnetic sensor (34), comprising: a magnetic field generator (84b, 84c) that generates a coded data signal determined to be inherent to the working area (70) and supplies the electric current in the generated coded data signal to the boundary wire (72); wherein the position determining unit (42a, S12-S28) detects the data signal from the output of the magnetic sensor (34) and determines the position of the vehicle (10) with respect to the working area (70) based on a rate of concordance of the detected data signal and a reference signal.

With this, since the position (self-position) of the vehicle 10 with respect to the working area 70 can therefore be determined based on the data signal determined to be inherent to the working area 70, it becomes unnecessary to performing synchronization processing of the received data signal and the reference signal. Moreover, the fact that the position of the vehicle 10 is determined based on the concordance rate of the signals makes unnecessary the conventional practice of establishing a threshold value for avoiding the influence of noise and thus enables accurate signal reception even at a position remote from the boundary wire 72, i.e., enables control of the vehicle 10 in a large working area.

In the apparatus and method, the position determining unit determines whether the vehicle (10) is inside the working area (70) based on the rate of concordance when a number of matches of values of the detected data signal and the reference signal is equal to or greater than a number of inversions of values of the detected data signal and the reference signal, whereby, in addition to the aforesaid effects, the position of the vehicle 10 with respect to the working area 70 can be more accurately determined.

In the apparatus and method, the position determining unit determines whether the vehicle (10) is outside the working area (70) based on a rate of inversion concordance indicating a rate of number of inversions of the detected data signal relative to the reference signal when a number of matches of values of the detected data signal and the reference signal is less than a number of inversions of values of the detected data signal and the reference signal, whereby, in addition to the aforesaid effects, the position of the vehicle 10 with respect to the working area 70 can be more accurately determined.

In the apparatus and method, the position determining unit determines that no electric current is supplied to the boundary wire (72) when the rate of concordance is less than a threshold value, whereby, in addition to the aforesaid effects, condition of the magnetic field generator 84b, 84c can also be determined.

In the apparatus and method, the position determining unit determines that no electric current is supplied to the boundary wire (72) when the rate of inversion concordance is less than a threshold value, whereby, in addition to the aforesaid effects, condition of the magnetic field generator 84b, 84c can also be determined.

In the apparatus and method, the generated data signal is of random signal length L, whereby, in addition to the aforesaid effects, additional types of control can be performed in response to the detected signal data. For example, it can be defined in advance to cause the vehicle 10 to be forcibly stopped, moved to a specified location or otherwise controlled, when purpose-specific data signals are detected. Further, by including working-area-specific data signals, a configuration enabling a single vehicle to service multiple areas can be realized. It is also possible to arrange for each operator to use an individualized data sequence, whereby the vehicle 10 can be protected by more robust theft deterrence without need for conventional ID authentication processing.

In the apparatus and method, the generated data signal is of random period, whereby, in addition to the aforesaid effects, interference with a magnetic field generated by another apparatus can be positively avoided and the position of the vehicle 10 with respect to the working area 70 can therefore be more accurately determined.

In the apparatus and method, the reference signal comprises a signal that is same as the detected data signal when the vehicle (10) is at one of a location inside of the working area (70) and a location outside of the working area (70). More specifically, the reference signal comprises a signal same as the detected data signal when the vehicle (10) is inside the working area (70). With this, the position of the vehicle 10 with respect to the working area 70 can therefore be determined more easily.

In the apparatus and method, the generated data signal is a signal binarized as 0, 1. With this, the position of the vehicle 10 with respect to the working area 70 can therefore be determined more easily.

While the invention has thus been shown and described with reference to specific embodiment, it should be noted that the invention is in no way limited to the details of the described arrangement; changes and modifications may be made without departing from the scope of the appended claims.

What is claimed is:

1. An apparatus for controlling operation of an autonomously navigating utility vehicle adapted to run about a working area, defined by a boundary wire which generates magnetic field therearound when supplied with electric current, to perform working autonomously, and having a magnetic sensor that produces an output indicating intensity of magnetic field generated by the boundary wire and a position determining unit that determines a position of the vehicle with respect to the working area based on the output of the magnetic sensor, comprising:

a magnetic field generator that generates coded data signals and supplies the electric current in the generated coded data signals to the boundary wire, each of the coded data signals comprising a continuance data sequence including a plurality of pulse signals, including a reference signal determined to be inherent to the working area and an additional signal for controlling operation of the utility vehicle, the additional signal being different from the reference signal and added to the reference signal, wherein a signal length of each of the coded data signals changes according to a signal length of the additional signal, wherein the position determining unit detects the coded data signals from the output of the magnetic sensor and determines the position of the vehicle with respect to the working area based on comparison between a rate of concordance of the coded detected data signals and the reference signal and a threshold value, and wherein the magnetic field generator generates the coded data signals so as to set a time interval between the coded data signals randomly.

2. The apparatus according to claim 1, wherein the position determining unit determines whether the vehicle is inside the working area based on comparison between the rate of concordance and the threshold value when a number of matches of values of the detected coded data signals and the reference signal is equal to or greater than a number of inversions of values of the detected coded data signals and the reference signal.

3. The apparatus according to claim 1, wherein the position determining unit determines whether the vehicle is outside the working area based on comparison between a rate of inversion concordance indicating a rate of number of inversions of the detected coded data signals relative to the reference signal and the threshold value when a number of matches of values of the detected coded data signals and the reference signal is less than a number of inversions of values of the detected coded data signals and the reference signal.

4. The apparatus according to claim 2, wherein the position determining unit determines that no electric current is supplied to the boundary wire when the rate of concordance is less than the threshold value.

5. The apparatus according to claim 3, wherein the position determining unit determines that no electric current is supplied to the boundary wire when the rate of inversion concordance is less than the threshold value.

6. The apparatus according to claim 1, wherein the reference signal comprises a signal that is same as the detected coded data signals when the vehicle is at one of a location inside of the working area and a location outside of the working area.

7. The apparatus according to claim 6, wherein the reference signal comprises a signal same as the detected coded data signals when the vehicle is inside the working area.

8. The apparatus according to claim 1, wherein the generated coded data signals are signals binarized as 0, 1.

9. A method for controlling operation of an autonomously navigating utility vehicle adapted to run about a working area, defined by a boundary wire which generates magnetic field therearound when supplied with electric current, to perform working autonomously and having a magnetic sensor that produces an output indicating intensity of magnetic field generated by the boundary wire, comprising steps of:

determining a position of the vehicle with respect to the working area based on the output of the magnetic sensor, and generating coded data signals and supplying the electric current in the generated coded data signals to the boundary wire, each of the coded data signals comprising a continuance data sequence including a plurality of pulse signals, including a reference signal and an additional signal for controlling operation of the utility vehicle, and being determined to be inherent to the working area, the additional signal being different from the reference signal and added to the reference signal, wherein a signal length of each of the coded data signals changes according to a signal length of the additional signal, wherein the step of position determining detects the coded data signals from the output of the magnetic sensor and determines the position of the vehicle with respect to the working area based on comparison between a rate of concordance of the detected coded data signals and the reference signal and a threshold value, and wherein the step of magnetic field generating generates the coded data signals so as to set a time interval between the coded data signals randomly.

10. The method according to claim 9, wherein the step of position determining determines whether the vehicle is inside the working area based on comparison between the rate of concordance and the threshold value when a number of matches of values of the detected coded data signals and the reference signal is equal to or greater than a number of inversions of values of the detected coded data signals and the reference signal.

11. The method according to claim 9, wherein the step of position determining determines whether the vehicle is outside the working area based on comparison between a rate of inversion concordance indicating a rate of number of inversions of the detected coded data signals relative to the reference signal and the threshold value when a number of matches of values of the detected coded data signals and the reference signal is less than a number of inversions of values of the detected coded data signals and the reference signal.

12. The method according to claim 10, wherein the step of position determining determines that no electric current is supplied to the boundary wire when the rate of concordance is less than the threshold value.

13. The method according to claim 11, wherein step of the position determining determines that no electric current is supplied to the boundary wire when the rate of inversion concordance is less than the threshold value.

14. The method according to claim 9, wherein the reference signal comprises a signal that is same as the detected coded data signals when the vehicle is at one of a location inside of the working area and a location outside of the working area.

15. The method according to claim 14, wherein the reference signal comprises a signal same as the detected coded data signals when the vehicle is inside the working area.

16. The method according to claim 9, wherein the generated coded data signals are signals binarized as 0, 1.

* * * * *